United States Patent
Liu et al.

(10) Patent No.: US 11,050,397 B2
(45) Date of Patent: Jun. 29, 2021

(54) INTERPOLATION OPERATIONAL AMPLIFIER CIRCUIT AND DISPLAY PANEL

(71) Applicant: SHANGHAI SEEO OPTRONICS TECHNOLOGY CO., LTD, Shanghai (CN)

(72) Inventors: Ping-Lin Liu, Shanghai (CN); Haodong Zhang, Shanghai (CN)

(73) Assignee: SEEYA OPTRONICS CO., LTD., Shanghai (CN)

(*) Notice: Subject to any disclaimer, the term of this patent is extended or adjusted under 35 U.S.C. 154(b) by 0 days.

(21) Appl. No.: 16/875,342

(22) Filed: May 15, 2020

(65) Prior Publication Data

US 2021/0111680 A1  Apr. 15, 2021

(30) Foreign Application Priority Data

Oct. 15, 2019  (CN) .......................... 201910975658.7

(51) Int. Cl.
*H03F 3/45* (2006.01)

(52) U.S. Cl.
CPC .  *H03F 3/4521* (2013.01); *H03F 2203/45144* (2013.01); *H03F 2203/45508* (2013.01)

(58) Field of Classification Search
CPC ......... H03F 3/4521; H03F 2203/45144; H03F 2203/45508; H03F 3/45; H03F 3/45179; H03F 3/45183; H03F 3/45188; H03F 3/45192; H03F 2200/177
USPC ................................................ 330/251–261
See application file for complete search history.

(56) References Cited

U.S. PATENT DOCUMENTS

2005/0190139 A1  9/2005  Fujiyoshi

FOREIGN PATENT DOCUMENTS

| CN | 101242169 A | 8/2008 |
| CN | 102081912 A | 6/2011 |
| CN | 102611451 A | 7/2012 |
| CN | 107749709 A | 3/2018 |
| CN | 108832916 A | 11/2018 |

(Continued)

OTHER PUBLICATIONS

First Office Action in Application No. CN 201910975658.7 dated Nov. 28, 2019.

(Continued)

*Primary Examiner* — Khanh V Nguyen
*Assistant Examiner* — Khiem D Nguyen
(74) *Attorney, Agent, or Firm* — Knobbe Martens Olson & Bear LLP

(57) ABSTRACT

Provided is an interpolation operational amplifier circuit, including: at least two sets of differential input pair transistors, each differential input pair transistor including first and second transistors, wherein base terminals of the first and second transistors are electrically connected to serve as a base terminal of the differential input pair transistor, and source electrodes of the first and second transistors are electrically connected to serve as a source electrode of the differential input pair transistor; and a voltage control unit electrically connected to the base terminal and source electrode of the differential input pair transistor, and configured to control a voltage of the base terminal of the P-type differential input pair transistor to be smaller than the first power supply voltage, and/or to control a voltage of the base terminal of the N-type differential input pair transistor to be larger than the second power supply voltage.

13 Claims, 9 Drawing Sheets

(56) References Cited

FOREIGN PATENT DOCUMENTS

| | | |
|---|---|---|
| CN | 209030163 U | 6/2019 |
| JP | H01192209 A | 8/1989 |

OTHER PUBLICATIONS

Notification to Grant Patent Right for Invention in Application No. CN 201910975658.7 dated Dec. 11, 2019.

INTERPOLATION OPERATIONAL AMPLIFIER CIRCUIT AND DISPLAY PANEL

CROSS-REFERENCE TO RELATED APPLICATIONS

The present application claims the benefit of priority to Chinese Patent Application No. 201910975658.7, filed on Oct. 15, 2019, the content of which is incorporated herein by reference in its entirety.

TECHNICAL FIELD

The present disclosure relate to the field of display technologies, and in particular, to an interpolation operational amplifier circuit and a display panel.

BACKGROUND

A display panel includes a source driver, which provides a data voltage signal for display of the display panel. Generally, the source driver includes a digital analog converter (DAC), which converts a digital signal of a data voltage into an analog signal of the data voltage to drive the display panel to display an image. In order to display a richer image content, the display panel requires a multi-bit digital signal for representing images of different grayscales. When the multi-bit digital signal is converted into an analog signal by the DAC, the more digital signals leads to the more complicated circuit for the DAC and the larger area occupied by the source driver on the display panel. In order to achieve miniaturization of the source driver, the source driver includes an interpolation circuit. The interpolation circuit includes a high level input terminal and a low level input terminal for inputting analog signals outputted from the DAC. The interpolation circuit obtains data voltages corresponding to grayscales within a high-level range and a low-level range by inputting high levels and low levels. Therefore, data voltages corresponding to the grayscales within the range of the analog signals outputted from the DAC can be obtained through the interpolation circuit, thereby reducing complexity of the circuit of the DAC and further reducing the area occupied by the source driver on the display panel. When the interpolation circuit has a poor linearity, there is a certain difference between the data voltages obtained by the interpolation circuit and standard data voltages corresponding to the grayscales, so that the data voltages outputted from the source driver are different from expected data voltages. In this case, there is a deviation in the grayscales displayed by the display panel.

SUMMARY

The present disclosure provides an interpolation operational amplifier circuit and a display panel, aiming to improve linearity and an interpolation range of the interpolation operational amplifier circuit, thereby improving a display accuracy of the display panel.

In a first aspect, an embodiment of the present disclosure provides an interpolation operational amplifier circuit, including: a first power supply input terminal and a second power supply input terminal, wherein a first power supply voltage of the first power supply input terminal is larger than a second power supply voltage of the second power supply input terminal; at least two sets of differential input pair transistors, each set of differential input pair transistors including a P-type differential input pair transistor composed of P-type transistors and an N-type differential input pair transistor composed of N-type transistors, wherein each differential input pair transistor of the at least two sets of differential input pair transistors includes a first transistor and a second transistor, a gate electrode of the first transistor of at least one set of the at least two sets of differential input pair transistors is electrically connected to a first input terminal of the interpolation operational amplifier circuit, and a gate electrode of the first transistor of at least another set of the at least two sets of differential input pair transistors is electrically connected to a second input terminal of the interference operational amplifier circuit; for each differential input pair transistor of the at least two sets of differential input pair transistors, base terminals of the first transistor and the second transistor of the differential input pair transistor are electrically connected to each other to serve as a base terminal of the differential input pair transistor, and source electrodes of the first transistor and the second transistor of the differential input pair transistor are electrically connected to each other to serve as a source electrode of the differential input pair transistor; and voltage control units each electrically connected to the base terminal of the differential input pair transistor and the source electrode of the differential input pair transistor, and configured to control a voltage of the base terminal of the P-type differential input pair transistor to be smaller than the first power supply voltage of the first power supply input terminal, and/or to control a voltage of the base terminal of the N-type differential input pair transistor to be larger than the second power supply voltage of the second power supply input terminal.

In an implementation, each of the voltage control units includes a conductive wire, and the conductive wire is electrically connected to the base terminal and the source electrode of the differential input pair transistor.

In an implementation, each of the voltage control units includes a first voltage input terminal; the first voltage input terminal is electrically connected to the base terminal of the differential input pair transistor, so as to provide a first voltage to the base terminal of the differential input pair transistor; the first voltage is smaller than a voltage of a source electrode of the P-type differential input pair transistor, and the first voltage is larger than a voltage of the source electrode of the N-type differential input pair transistor.

In an implementation, a difference between the first voltage and the voltage of the source electrode of the differential input pair transistor is smaller than a PN junction forward turn-on voltage between the base terminal and the source electrode of the differential input pair transistor.

In an implementation, each of the voltage control units further includes at least one first source follower; each of the at least one first source follower includes an input terminal electrically connected to the source electrode of the differential input pair transistor, and an output terminal electrically connected to the base terminal of the differential input pair transistor.

In an implementation, a turn-on voltage of the at least one first source follower is smaller than a turn-on voltage between the base terminal and the source electrode of the differential input pair transistor.

In an implementation, the at least one first source follower includes a plurality of first source followers, and each first source follower is a PMOS transistor or an NMOS transistor; the P-type differential input pair transistor is electrically connected to the NMOS transistor, and the N-type differential input pair transistor is electrically connected to the PMOS transistor. Each of the PMOS transistor and the NMOS transistor includes: a gate electrode that is an input terminal of one of the plurality of first source followers, and a source electrode that is an output terminal of one of the plurality of first source followers; the PMOS transistor further includes a drain electrode electrically connected to the second power supply input terminal, and the NMOS transistor further includes a drain electrode electrically connected to the first power supply input terminal.

In an implementation, the voltage control units further include a second voltage input terminal and a third voltage input terminal; the second voltage input terminal is electrically connected to a base terminal of the PMOS transistor, so as to provide a second voltage to the base terminal of the PMOS transistor; the third voltage input is electrically connected to a base terminal of the NMOS transistor, so as to provide a third voltage to the base terminal of the NMOS transistor; the second voltage is smaller than a voltage of the source electrode of the PMOS transistor, and the third voltage is larger than a voltage of the source electrode of the NMOS transistor.

In an implementation, the voltage control units further include at least two second source followers, the at least two second source followers include: at least one second source follower including an input terminal electrically connected to the source electrode of the PMOS transistor, and an output terminal electrically connected to the base terminal of the PMOS transistor; and at least one second source follower including an input terminal electrically connected to the second power supply input terminal, and an output terminal electrically connected to the base terminal of the NMOS transistor.

In an implementation, the voltage control units further include at least one current source connected in series between the base terminal of the PMOS transistor and the source electrode of the PMOS transistor and/or connected in series between the base terminal of the NMOS transistor and the second power supply input terminal.

In an implementation, the at least two sets of differential input pair transistors include four differential input pair transistors forming a differential stage amplifier circuit of the interpolation operational amplifier circuit, the four differential input pair transistors including a first differential input pair transistor, a second differential input pair transistor, a third differential input pair transistor and a fourth differential input pair transistor. The gate electrode of the first transistor of the first differential input pair transistor and the gate electrode of the first transistor of the third differential input pair transistor are electrically connected to the first input terminal of the interpolation operational amplifier circuit, and the gate electrode of the first transistor of the second differential input pair transistor and the gate electrode of the first transistor of the fourth differential input pair transistor are electrically connected to the second input terminal of the interpolation operational amplifier circuit; the gate electrodes of the second transistors of the four differential input pair transistors are electrically connected to an output terminal of the interpolation operational amplifier circuit; a drain electrode of the first transistor of the first differential input pair transistor and a drain electrode of the transistor of the second differential input pair transistor are electrically connected to a first output terminal of the differential stage amplifier circuit, and a drain electrode of the second transistor of the first differential input pair transistor and a drain electrode of the second transistor of the second differential input pair transistor are electrically connected to a second output terminal of the differential stage amplifier circuit; the source electrodes of the first differential input pair transistor and the second differential input pair transistor are electrically connected to a negative terminal of the first current source; a positive terminal of the first current source, and base terminals of the first differential input pair transistor and the second differential input pair transistor are electrically connected to the first power supply input terminal of the interpolation operational amplifier circuit. The gate electrodes of the second transistors of the third differential input pair transistor and the fourth differential input pair transistor are electrically connected to the output terminal of the interpolation operational amplifier circuit; a drain electrode of the first transistor of the third differential input pair transistor and a drain electrode of the first transistor of the fourth differential input pair transistor are electrically connected to a third output terminal of the differential stage amplifier circuit; a drain electrode of the second transistor of the third differential input pair transistor and a drain electrode of the second transistor of the fourth differential input pair transistor are electrically connected to a fourth output terminal of the differential stage amplifier circuit; the source electrodes of the third differential input pair transistor and the fourth differential input pair transistor are electrically connected to a positive terminal of a second current source; a negative terminal of the second current source, and the base terminals of the third differential input pair transistor and the fourth differential input pair transistor are electrically connected to the second power supply input terminal of the interpolation operational amplifier circuit.

In an implementation, the first and second transistors of the first differential input pair transistor and the second differential input pair transistor are PMOS transistors; and the first and second transistors of the third differential input pair transistor and the fourth differential input pair transistor are NMOS transistors.

In an implementation, the interpolation operational amplifier circuit further includes an intermediate stage amplifier circuit and an output stage amplifier circuit. The differential stage amplifier circuit includes: a first output terminal electrically connected to a first input terminal of the intermediate stage amplifier circuit, a second output terminal electrically connected to a second input terminal of the intermediate stage amplifier circuit, a third output terminal electrically connected to a third input terminal of the intermediate stage amplifier circuit, and a fourth output terminal electrically connected to a fourth input terminal of the intermediate stage amplifier circuit; the intermediate stage amplifier circuit includes a first output terminal electrically connected to a first input terminal of the output stage amplifier circuit, and a second output terminal electrically connected to a second input terminal of the output stage amplifier circuit; and output stage amplifier circuit includes an output terminal that is the output terminal of the interpolation operational amplifier circuit.

In a second aspect, an embodiment of the present disclosure provides a display panel, including: a substrate and a source driver. The source driver includes the interpolation operational amplifier circuit provided by any embodiment described above. The substrate has a display area and a non-display area. The source driver is arranged in the non-display area, and the source driver is electrically connected to a data signal line of the display panel, so as to provide a data signal to the display panel.

In the technical solution of the embodiments of the present disclosure, the voltage control unit is provided between the base terminal and the source electrode of the differential input pair transistor, so as to control the voltage difference between the base terminal and the source electrode of the differential input pair transistor to be a constant. In this way, the threshold voltage of the differential input pair transistor can be controlled to be a constant, thereby improving the linearity of the differential input pair transistor and further improving the linearity of the interpolation operational amplifier circuit. Moreover, the voltage control unit controls the voltage difference between the base terminal and the source electrode of the differential input pair transistor to be decreased, so that the threshold voltage of the differential input pair transistor is decreased, and thus the voltage difference between the first input terminal and the second input terminal of the differential input pair transistor can be within a larger range.

BRIEF DESCRIPTION OF DRAWINGS

FIG. 11 is a schematic diagram of a structure of a display panel according to an embodiment of the present disclosure.

DESCRIPTION OF EMBODIMENTS

The present disclosure will be further described in details in the following with reference to the accompanying drawings and embodiments. It can be understood that the specific embodiments described herein are only used to illustrate the present disclosure rather than limiting the present disclosure. It should be noted that for convenience of description, only some parts instead of all structures related to the present disclosure are shown in the accompany drawings.

Figure 1:
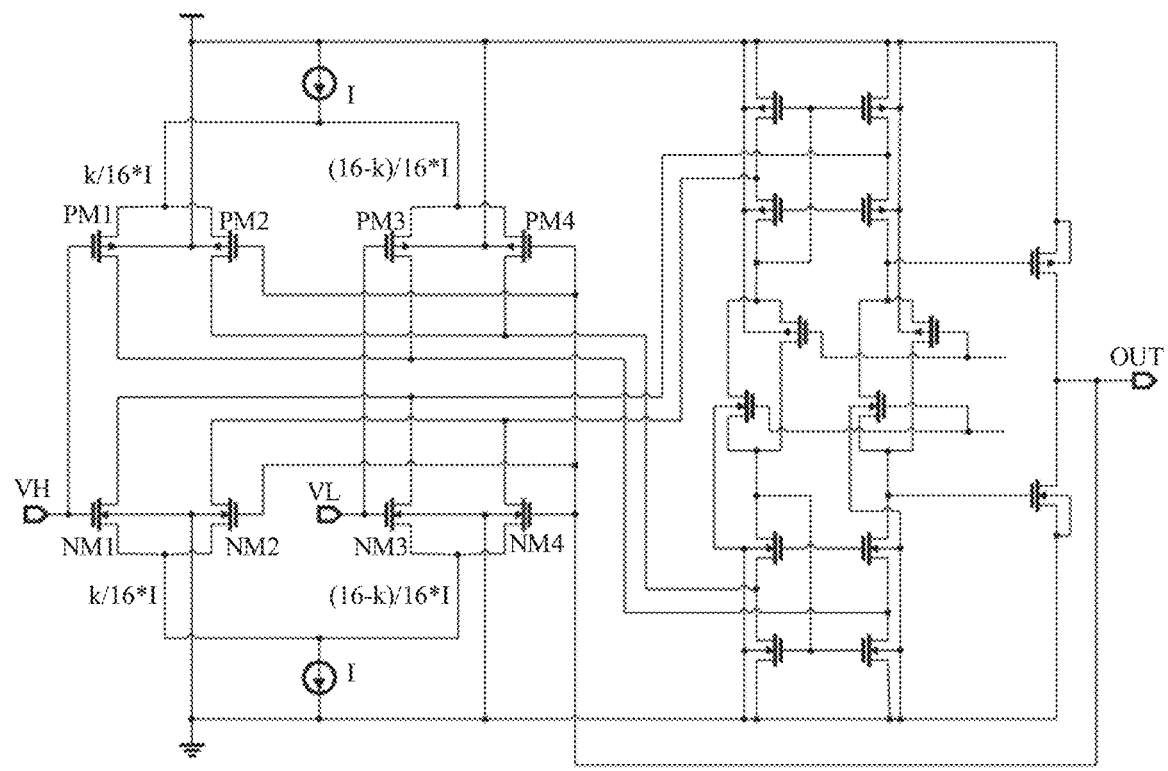
FIG. 1 is a schematic diagram of an interpolation operational amplifier circuit in the related art.

FIG. 1 is a schematic diagram of an interpolation operational amplifier circuit in the related art. As shown in FIG. 1, the interpolation operational amplifier circuit includes a high level input terminal VH and a low level input terminal VL. The high level input terminal VH is configured to input a maximum voltage of the interference operational amplifier circuit, and the low level input terminal VL is configured to input a minimum voltage of the interference operational amplifier circuit. The interpolation operational amplifier circuit further includes four differential input pair transistors. Here, a first differential input pair transistor includes a first P-type transistor PM1 and a second P-type transistor PM2; a second differential input pair transistor includes a third P-type transistor PM3 and a fourth P-type transistor PM4; a third differential input pair transistor includes a first N-type transistor NM1 and a second N-type transistor NM2; and a fourth differential input pair transistor includes a third N-type transistor NM3 and a fourth N-type transistor NM4. A gate electrode of the first P-type transistor PM1 and a gate electrode of the first N-type transistor NM1 are electrically connected to the high level input terminal VH, and a gate electrode of the third P-type transistor PM3 and a gate electrode of the third N-type transistor NM3 are electrically connected to the low level input terminal VL. A gate electrode of the second P-type transistor PM2, a gate electrode of the fourth P-type transistor PM4, a gate electrode of the second N-type transistor NM2, and a gate electrode of the fourth N-type transistor NM4 are all electrically connected to an output terminal OUT of the interpolation operational amplifier circuit. Source electrodes of the transistors of the differential input pair transistors are electrically connected to a current source, which provides a current to the transistors. The current provided by the current source is divided into branch currents that flow to the first differential input pair transistor and the third differential input pair transistor connected to the high level input terminal VH and to the second differential input pair transistor and the fourth differential input pair transistor connected to the low level input terminal VL. An interpolated value of the interpolation operational amplifier circuit can determine values of the branch currents into which the current is divided. For example, when the interpolated value of the interpolation operational amplifier circuit is 16, if the current provided by the current source is I, then a current flowing through the high level input terminal VH may be $$\frac{k*I}{16},$$

and a current flowing through the low level input terminal VL may be $$\frac{(16-k)*I}{16}.$$

Thus, a voltage outputted from the interpolation operational amplifier circuit is a voltage value generated based on a voltage Vh inputted by the high level input terminal VH and a voltage Vl inputted by the low level input terminal VL according to a current division principle, as shown in formula (1):

$$\text{out} = \frac{k*Vh + (16-k)*Vl}{16} \qquad (1)$$
$$k = 0, 1, 2 \ldots, 15,$$

where out represents the voltage outputted from the output terminal of the interpolation operational amplifier circuit OUT, Vh represents the voltage inputted by the high level input terminal VH, Vl represents the voltage inputted by the low level input terminal VL, and k is a constant.

When k takes a different value, the current flowing through the differential input pair transistors changes, and a voltage of a source electrode the differential input pair transistors changes. For example, for the first P-type transistor PM1, when k takes a smaller value, the current flowing through the first P-type transistor PM1 is decreased. A voltage VG of the gate electrode of the first P-type transistor PM1 is the voltage Vh inputted by the high level input terminal VH, which does not change, and an equivalent resistance of the first P-type transistor PM1 does not change. Therefore, a voltage drop of the first P-type transistor PM1 is decreased, that is, $V_{GS}$ is decreased, so that a voltage $V_S$ of the source electrode of the first P-type transistor PM1 is increased. The first P-type transistor PM1 includes a base terminal electrically connected to a power input terminal of the interpolation operational amplifier circuit, so a voltage $V_B$ of the base terminal of the first P-type transistor PM1 is a constant. Therefore, a voltage difference $V_{SB}$ between the source electrode and the base terminal of the first P-type transistor PM1 is increased. Accordingly, the voltage difference $V_{SB}$ between the source electrode and the base terminal of the first P-type transistor PM1 changes. According to a formula (2) as follows, it is known that when the voltage difference $V_{SB}$ between the source electrode and the base terminal of the first P-type transistor PM1 changes, a threshold voltage $V_{TH}$ of the differential input pair transistor changes.

$$V_{TH}=V_{TH0}+\gamma(\sqrt{2\varnothing_F+B_{SB}}-\sqrt{2\varnothing_F}), \quad (2)$$

where $V_{TH}$ represents the threshold voltage of the differential input pair transistor, $V_{TH0}$ represents an eigenvalue of the threshold voltage, $V_{SB}$ represents a voltage difference between the source electrode and the base terminal of the differential input pair transistor, OF represents an eigenparameter of the differential input pair transistor, and γ represents a constant of the differential input pair transistors, which is related to a process of the differential input pair transistor.

In addition, the smaller current leads to the smaller $V_{GS}$ of the first P-type transistor PM1 and the larger voltage $V_S$ of the source electrode. The voltage $V_B$ of the base terminal of the first P-type transistor PM1 is a constant, so the larger the $V_{SB}$ is, the larger the $V_{TH}$ is, as seen from formula (2). A change in the threshold voltage $V_{TH}$ causes a poor linearity of the first P-type transistor PM1. Therefore, when k takes a different value, the linearity of the voltage value generated based on the voltage out outputted from the interpolation operational amplifier circuit according to the current division principle is poor, that is, the linearity of the interpolation operational amplifier circuit is poor.

Figure 2:
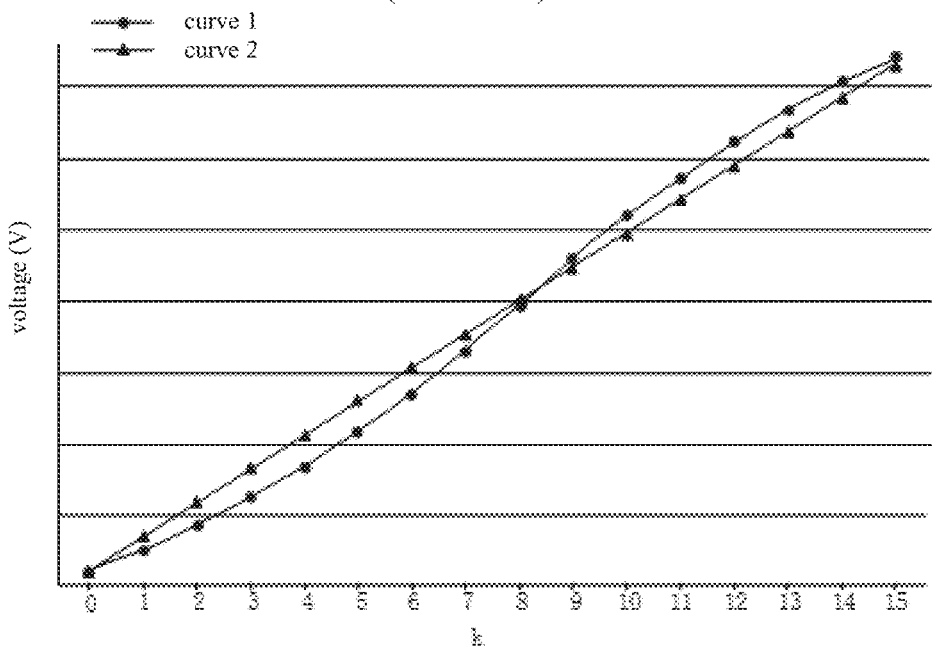
FIG. 2 illustrates a relationship between interpolated values and output voltages of an interpolation operational amplifier circuit in the related art.

In addition, a formula of the current flowing through the first P-type transistor PM1 is as follows:

$$I_D = \frac{1}{2}\mu Cox\frac{w}{L}(V_{GS} - V_{TH})^2, \quad (3)$$

where $I_D$ is the current of the first P-type transistor PM1, μ is a carrier mobility of the first P-type transistor PM1, $$\frac{W}{L}$$

is a channel width-to-length ratio of the first P-type transistor PM1, $V_{GS}$ is a gate-to-source voltage of the first P-type transistor PM1, and $V_{TH}$ is a threshold voltage of the first P-type transistor PM1. Therefore, a change of $V_{GS}$ with time involves an affection from the threshold voltage $V_{TH}$, thereby further causing poorer linearity of the interpolation operational amplifier circuit. FIG. 2 illustrates a relationship between interpolated values and output voltages of an interpolation operational amplifier circuit in the related art. Here, an abscissa represents an interpolated value k, and an ordinate represents an output voltage corresponding to a different interpolated value. A curve 1 illustrates output voltage values corresponding to different interpolated values of the interpolation operational amplifier circuit in the related art, and a curve 2 illustrates output voltage values corresponding to different interpolated values of an ideal interpolation operational amplifier circuit. As can be seen from FIG. 2, the linearity of the existing interpolation operational amplifier circuit is relatively poor.

In addition, a range of the voltage out outputted from the interpolation operational amplifier circuit depends on the voltage Vh inputted by the high level input terminal VH and the voltage V1 inputted by the low level input terminal VL. A normal operation can be performed only when the gate-to-source voltage $V_{GS}$ of the differential input pair transistor is larger than the threshold voltage $V_{TH}$ of the differential input pair transistor. If the voltage V1 inputted by the low level input terminal VL is too small and smaller than the threshold voltage $V_{TH}$, it can be known from formula (1) that when k=0, the voltage out outputted from the interpolation operational amplifier circuit is the minimum value V1. At this time, the first differential input pair transistor and the third differential input pair transistor are turned off. When the voltage Vh inputted by the high level input terminal VH is too large, the voltages $V_S$ of the source electrodes of the first differential input pair transistor and the third differential input pair transistor will be increased, resulting in that a difference (out-$V_S$) between the voltage out outputted from the interpolation operational amplifier circuit and the voltage $V_S$ of the source electrode is smaller than the threshold voltage $V_{TH}$ of the differential input pair transistor, which causes an abnormal operation of the differential input pair transistor. At this time, the threshold voltage $V_{TH}$ will also affect an input range of the interpolation operational amplifier circuit. According to formula (3), it can be known that when the current is a constant, the larger the voltage $V_S$ of the source electrode is, the larger threshold voltage $V_{TH}$ might more easily cause the voltage out outputted from the interpolation operational amplifier circuit to be fed back to the differential input pair transistor, which is then turned off. Therefore, a difference between the voltage Vh inputted by the high level input terminal VH and the voltage V1 inputted by the low level input terminal VL is relatively small.

Figure 3:
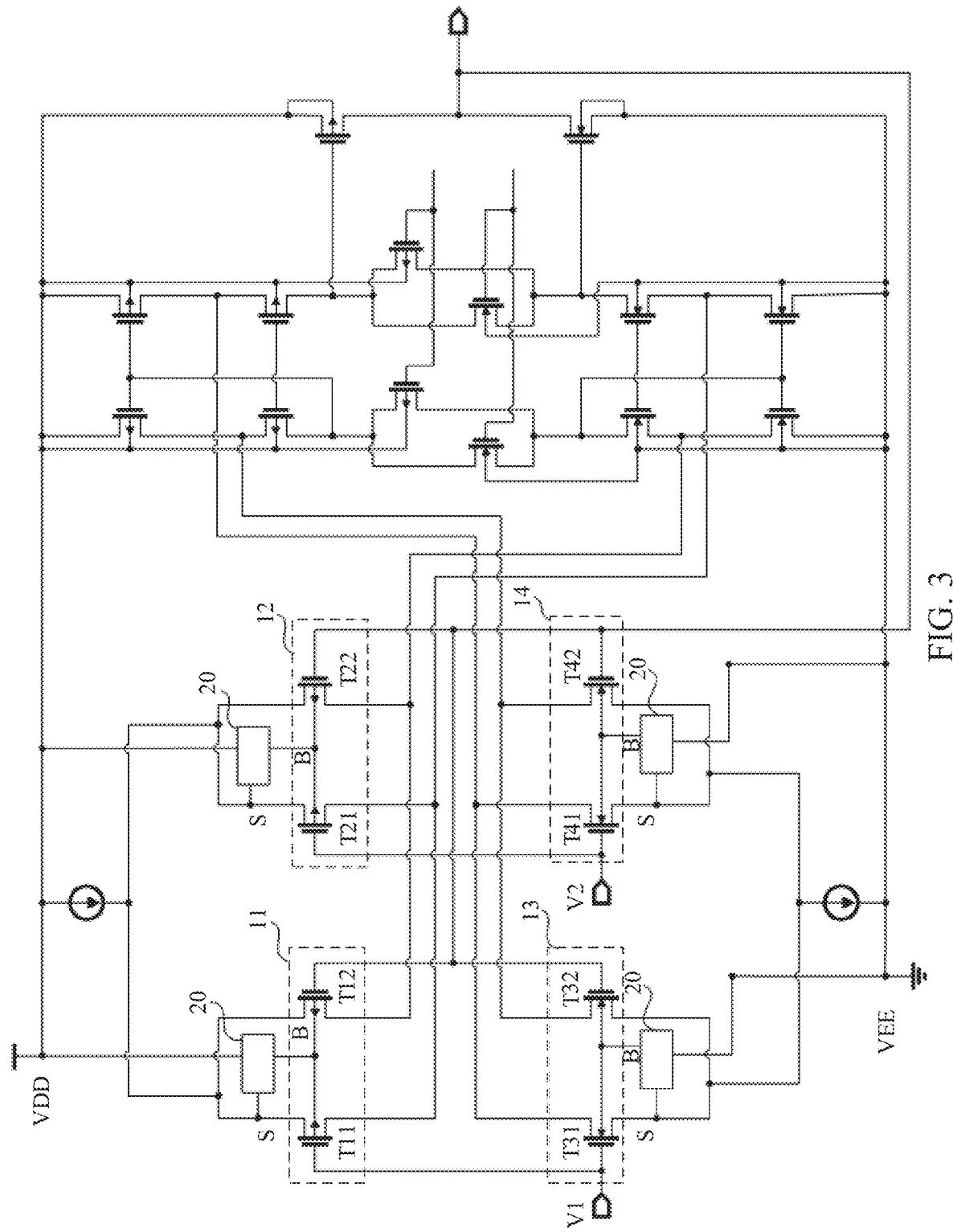
FIG. 3 is a schematic diagram of an interpolation operational amplifier circuit according to an embodiment of the present disclosure.

In view of the above technical problems, an embodiment of the present disclosure provides an interpolation operational amplifier circuit. FIG. 3 is a schematic diagram of an interpolation operational amplifier circuit according to an embodiment of the present disclosure. As shown in FIG. 3, the interpolation operational amplifier circuit includes:

a first power supply input terminal VDD and a second power supply input terminal VEE, a first power supply voltage of the first power supply input terminal VDD being larger than a second power supply voltage of the second power supply input terminal VEE;

at least two sets of differential input pair transistors, each set of differential input pair transistors including a P-type differential input pair transistor composed of P-type transistors and an N-type differential input pair transistor composed of N-type transistors, each differential input pair transistor includes a first transistor and a second transistor, a gate electrode of the first transistor of at least one set of differential input pair transistors is electrically connected to a first input terminal V1 of the interpolation operational amplifier circuit, and a gate electrode of the first transistor of at least one set of differential input pair transistors is electrically connected to a second input terminal V2 of the interference operational amplifier circuit, a base terminal of the first transistor of the differential input pair transistor and a base terminal of the second transistor of the differential input pair transistor are electrically connected to each other to serve as a base terminal B of the differential input pair transistor, and a source electrode of the first transistor of the differential input pair transistor and a source electrode of the second transistor of the differential input pair transistor electrically connected to each other to serve as a source electrode S of the differential input pair transistor; and a voltage control unit 20 electrically connected to the base terminal B of the differential input pair transistor and the source electrode S of the differential input pair transistor, and configured to control a voltage of the base terminal B of the P-type differential input pair transistor to be smaller than the first power supply voltage of the first power supply input terminal VDD, and/or to control a voltage of the base terminal B of the N-type differential input pair transistor to be larger than the second power supply voltage of the second power supply input terminal VEE.

Specifically, as shown in FIG. 3, the interpolation operational amplifier circuit exemplarily shows four differential input pair transistors, which are a first differential input pair transistor 11, a second differential input pair transistor 12, a third differential input pair transistor 13, and a fourth differential input pair transistor 14. The first differential input pair transistor 11 and the second differential input pair transistor 12 may be P-type differential input pair transistors, and the third differential input pair transistor 14 and the fourth differential input pair transistor 14 may be N-type differential input pair transistors. The first differential input pair transistor 11 and the second differential input pair transistor 12 will be described for illustration. The first differential input pair transistor 11 includes a first transistor T11 and a second transistor T12, and the second differential input pair transistor 12 includes a first transistor T21 and a second transistor T22. A gate electrode of the first transistor T11 of the first differential input pair transistor 11 is electrically connected to a first input terminal V1, and a gate electrode of the first transistor T21 of the second differential input pair transistor 12 is electrically connected to a second input terminal V2. A base terminal of the first transistor T11 of the first differential input pair transistor 11 and a base terminal of the second transistor T12 of the first differential input pair transistor 11 are electrically connected to each other to serve as a base terminal B of the first differential input pair transistor 11, and a base terminal of the first transistor T21 of the second differential input pair transistor 12 and a base terminal of the second transistor T22 of the second differential input pair transistor 12 are electrically connected to each other to serve as a base terminal B of the second differential input pair transistor 12. A source electrode of the first transistor T11 of the first differential input pair transistor 11 and a source electrode of the second transistor T12 of the first differential input pair transistor are electrically connected to each other to serve as a source electrode S of the first differential input pair transistor 11, and a source electrode of the first transistor T21 of the second differential input pair transistor 12 and a source electrode of the second transistor T22 of the second differential input pair transistor 12 are electrically connected to each other to serve as a source electrode S of the second differential input pair transistor 12.

The interpolation operational amplifier circuit further includes a voltage control unit 20, which is electrically connected to the base terminal B of the differential input pair transistor and the source electrode S of the differential input pair transistor. The voltage control unit 20 can control a voltage difference between the base terminal B and the source electrode S of the differential input pair transistor to be a constant, i.e., controlling a voltage $V_{SB}$ between the base terminal B and the source electrode S of the differential input pair transistor to be a constant, so that a threshold voltage $V_{TH}$ of the differential input pair transistor is a constant, which does not change with a current, thereby improving a linearity of the differential input pair transistor. When the threshold voltage $V_{TH}$ of the differential input pair transistor is a constant, $V_{GS}$ will not be affected by the threshold voltage $V_{TH}$ while changing with the current. Therefore, the linearity of the differential input pair transistor will be further improved, thereby improving the linearity of the interpolation operational amplifier circuit.

In addition, in combination with FIG. 1 and FIG. 3, in FIG. 1, the base terminal of the P-type transistor is electrically connected to a power supply terminal, so the voltage $V_B$ of the base terminal of the P-type transistor is the power supply voltage of the interpolation operational amplifier circuit. The control unit 20 controls the voltage of the base terminal B of the P-type differential input pair transistor to be smaller than the first power supply voltage inputted by the first power supply input terminal VDD. According to the formula (2), the voltage difference between the source electrode S and the base terminal B of the P-type differential input pair transistor is decreased, so that the threshold voltage $V_{TH}$ of the P-type differential input pair transistor can be decreased compared with a structure shown in FIG. 1. Therefore, a voltage difference between the first input terminal V1 and the second input terminal V2 of the P-type differential input pair transistor can be within a larger range.

Similarly, the third differential input pair transistor 13 and the fourth differential input pair transistor 14 in the interpolation operational amplifier circuit have a same structure. The third differential input pair transistor 13 includes a first transistor T31 and a second transistor T32, and the fourth differential input pair transistor 14 includes a first transistor T41 and a second transistor T42. A gate electrode of the first transistor T31 of the third differential input pair transistor 13 is electrically connected to the first input terminal V1, and a gate electrode of the first transistor T41 of the fourth differential input pair transistor 14 is electrically connected to the second input terminal V2. A voltage control unit 20 is electrically connected to a base terminal B and a source electrode S of the third differential input pair transistor 13 and the fourth differential input pair transistor 14, so as to control the voltage difference between the base terminal B and the source electrode S of the differential input pair transistors.

Similarly, the base terminal of the N-type transistor is electrically connected to the second power supply input terminal VEE, so the voltage $V_B$ of the base terminal of the N-type transistor is the second power supply voltage. The control unit 20 controls the voltage of the base terminal B of the N-type differential input pair transistor to be larger than the second power supply voltage inputted by the second power supply input terminal VEE. According to the formula (2), the voltage difference between the source electrode S and the base terminal B of the N-type differential input pair transistor is decreased, so that the threshold voltage $V_{TH}$ of the N-type differential input pair transistor can be reduced compared with a structure shown in FIG. 1. Therefore, a voltage difference between the first input terminal V1 and the second input terminal V2 of the N-type differential input pair transistor can be within a larger range.

Therefore, the voltage control unit 20 can control the $V_{SB}$ of the differential input pair transistor to be decreased, so that the threshold voltage $V_{TH}$ of the differential input pair transistor can be decreased. Therefore, a voltage difference between the first input terminal V1 and the second input terminal V2 of the differential input pair transistor can be within a larger range.

It should be noted that a number of voltage control units 20 may be equal to a number of differential input pair transistors. That is, each differential input pair transistor in the interference operational amplifier circuit can be provided with a respective voltage control unit 20, so as to control the voltage difference between the base terminal B and the source electrode S of each differential input pair transistor in the interference operational amplifier circuit. In this way, the linearity of the interpolation operational amplifier circuit can be further improved, and the voltage difference between the first input terminal V1 and the second input terminal V2 can be within a larger range.

In the technical solution of this embodiment, the voltage control unit is provided between the base terminal and the source electrode of the differential input pair transistor, so as to control the voltage difference between the base terminal and the source electrode of the differential input pair transistor to be a constant. In this way, the threshold voltage of the differential input pair transistor can be controlled to be a constant, thereby improving the linearity of the differential input pair transistor and further improving the linearity of the interpolation operational amplifier circuit. Moreover, the voltage control unit controls the voltage difference between the base terminal and the source electrode of the differential input pair transistor to be decreased, so that the threshold voltage of the differential input pair transistor is decreased, and thus the voltage difference between the first input terminal and the second input terminal of the differential input pair transistor can be within a larger range.

In an example, the voltage of the base terminal of the P-type differential input pair transistor is smaller than or equal to the voltage of the source electrode of the P-type differential input pair transistor, and/or the voltage of the base terminal of the N-type differential input pair transistor is larger than or equal to the voltage of the source electrode of the N-type differential input pair transistor. For the P-type differential input pair transistor and the N-type differential input pair transistor, the voltage difference between the source electrode S and the base terminal B of can be guaranteed to be smaller than or equal to zero, so that the threshold voltages $V_{TH}$ of the P-type differential input pair transistor and the N-type differential input pair transistor can be decreased. Therefore, for the P-type differential input pair transistor and the N-type differential input pair transistor, the voltage difference between the first input terminal V1 and the second input terminal V2 can be within a larger range.

Figure 4:
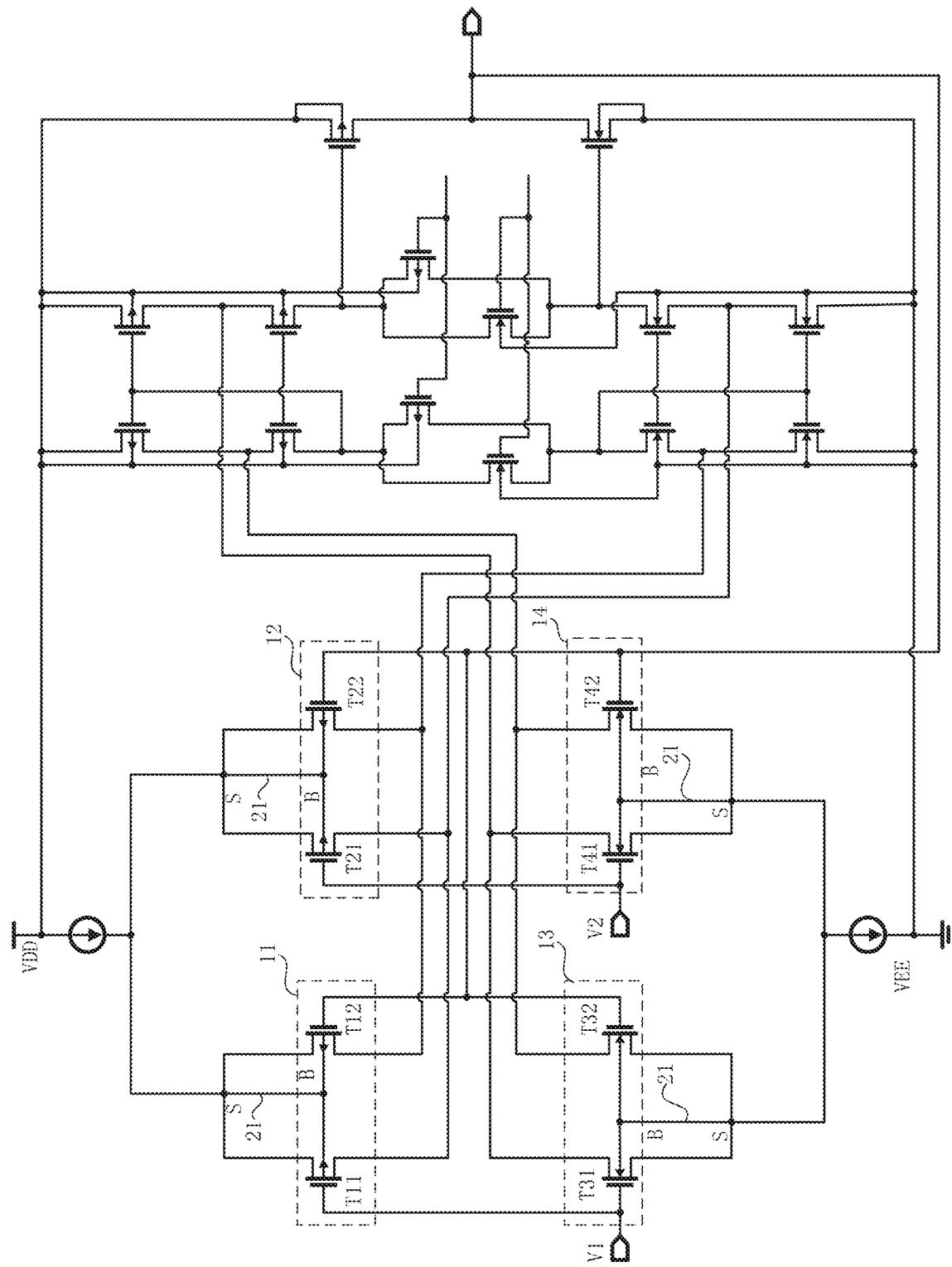
FIG. 4 is a schematic diagram of another interpolation operational amplifier circuit according to an embodiment of the present disclosure.

FIG. 4 is a schematic diagram of another interpolation operational amplifier circuit according to an embodiment of the present disclosure. As shown in FIG. 4, the voltage control unit 20 includes a conductive wire 21, and the conductive wire 21 is electrically connected to the base terminal B and the source electrode S of the differential input pair transistor.

Specifically, as shown in FIG. 4, the base terminal B of the differential input pair transistor is connected to the source electrode S of the differential input pair transistor by the conductive wire 21, that is, a voltage $V_{SB}$ between the base terminal B of the differential input pair transistor and the source electrode S of the differential input pair transistor is 0. According to the formula (2), it can be known that the threshold voltage $V_{TH}$ of the differential input pair transistor is equal to $V_{TH0}$, so the threshold voltage $V_{TH}$ of the differential input pair transistor is a constant, which does not change with the current, thereby improving the linearity of the differential input pair transistor. When the threshold voltage $V_{TH}$ of the differential input pair transistor is a constant, $V_{GS}$ will not be affected by the threshold voltage $V_{TH}$ while changing with the current. Therefore, the linearity of the differential input pair transistor will be further improved, thereby improving the linearity of the interpolation operational amplifier circuit. Moreover, the $V_{SB}$ of the differential input pair transistor is zero, so that the threshold voltage $V_{TH}$ of the differential input pair transistor can be quite small, and thus the voltage difference between the first input terminal V1 and the second input terminal V2 of the differential input pair transistor can be within a larger range.

Figure 5:
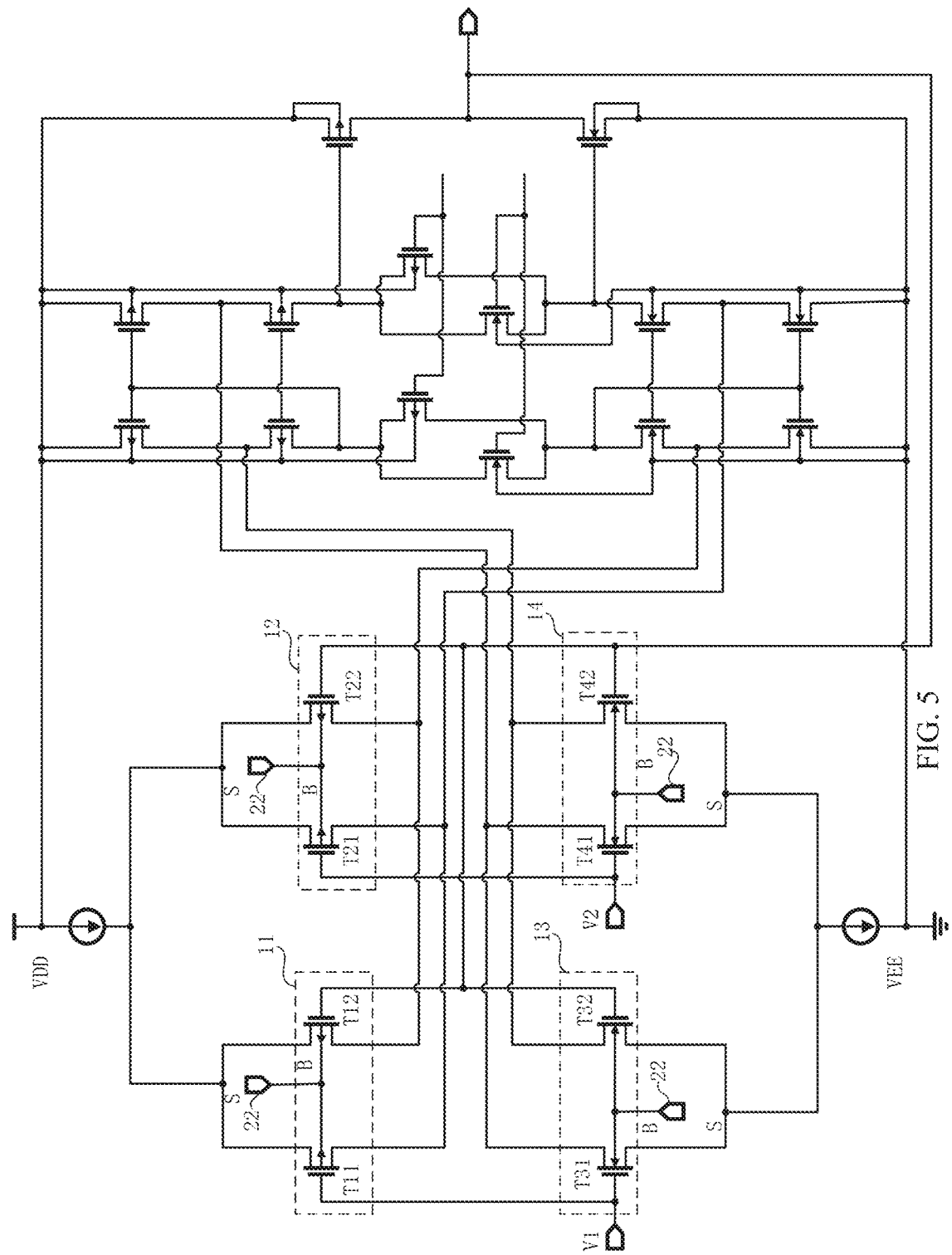
FIG. 5 is a schematic diagram of another interpolation operational amplifier circuit according to an embodiment of the present disclosure.

FIG. 5 is a schematic diagram of another interpolation operational amplifier circuit according to an embodiment of the present disclosure. As shown in FIG. 5, the voltage control unit 20 includes a first voltage input terminal 22, and the first voltage input terminal 22 is electrically connected to the base terminal B of the differential input pair transistor, so as to provide a first voltage to the base terminal B of the differential input pair transistor. The first voltage is smaller than the voltage of the source electrode of the P-type differential input pair transistor, and the first voltage is larger than the voltage of source electrode of the N-type differential input pair transistor.

Specifically, the first voltage is a constant, and thus the $V_{SB}$ of the differential input pair transistor is a constant, so that the threshold voltage $V_{TH}$ of the differential input pair transistor is a constant, thereby improving the linearity of the differential input pair transistor. The N-type differential input pair transistor will be described for illustration. In this example, the first voltage is larger than the voltage of the source electrode of the N-type differential input pair transistor, so that the $V_{SB}$ of the differential input pair transistor is a negative value. According to the formula (2), it can be known that the threshold voltage $V_{TH}$ of the N-type differential input pair transistor is smaller than $V_{TH0}$, i.e., $V_{TH} < V_{TH0}$ thereby further decreasing the threshold voltage $V_{TH}$ of the N-type differential input pair transistor. Therefore, the voltage difference between the first input terminal V1 and the second input terminal V2 of the differential input pair transistor can be within a larger range.

It should be noted that the P-type differential input pair transistor and the N-type differential input pair transistor have similar principles, which will not be further described herein.

With further reference to FIG. 5, a difference between the first voltage and the voltage of the source electrode of the differential input pair transistor is smaller than a PN junction forward turn-on voltage between the base terminal B and the source electrode S of the differential input pair transistor.

Specifically, there is a PN junction between the base terminal B and the source electrode S of the differential input pair transistor. When the difference between the voltage of the base terminal B and the voltage of the source electrode S of the differential input pair transistor can turn the PN junction on, that is, the difference between the voltage of the base terminal B and the voltage of the source electrode S of the differential input pair transistor is larger than the turn-on voltage of the PN junction, a leakage current is formed between the base terminal B and the source electrode S of the differential input pair transistor, thereby causing current consumption for the interpolation operational amplifier circuit. Therefore, the difference between the first voltage and the voltage of the source electrode of the differential input pair transistor can be set to be smaller than the turn-on voltage between the base terminal B and the source electrode S of the differential input pair transistor, thereby avoiding a leakage current formed between the base terminal B and the source electrode S of the differential input pair transistor, which would otherwise cause current consumption.

Figure 6:
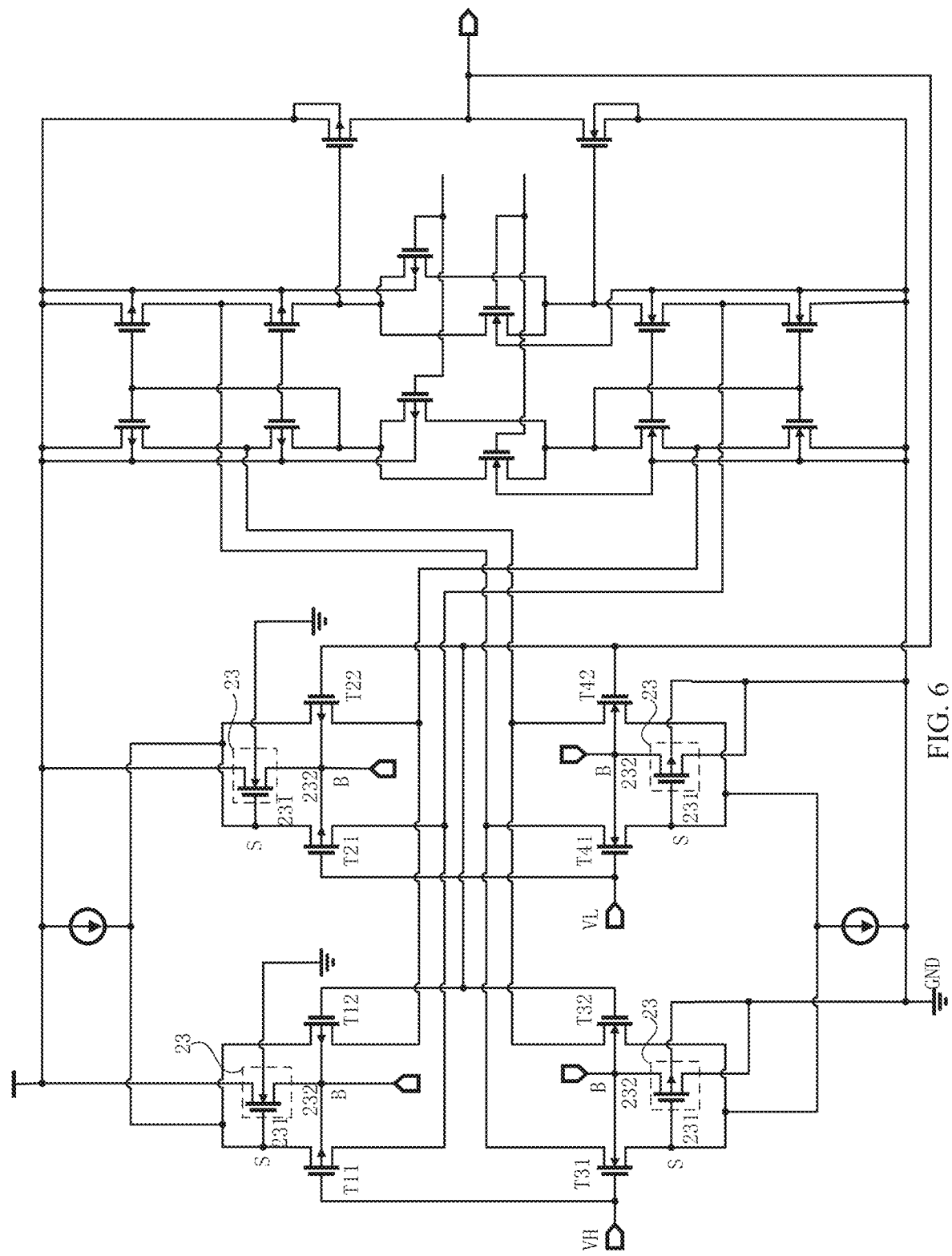
FIG. 6 is a schematic diagram of another interpolation operational amplifier circuit according to an embodiment of the present disclosure.

FIG. 6 is a schematic diagram of another interpolation operational amplifier circuit according to an embodiment of the present disclosure. As shown in FIG. 6, the voltage control unit 20 further includes a first source follower 23, and the first source follower 23 includes: an input terminal 231 electrically connected to the source electrode S of the differential input pair transistor, and an output terminal 232 electrically connected to the base terminal B of the differential input pair transistor.

Specifically, the first source follower 23 has a function of voltage maintenance. The input terminal 231 of the first source follower 23 is electrically connected to the source electrode S of the differential input pair transistor, and the output terminal 232 of the first source follower 23 is electrically connected to the base terminal B of the differential input pair transistor. In this way, the voltage difference between the source electrode S and the base terminal B of the differential input pair transistor is equal to a voltage difference between the input terminal 231 of the first source follower 23 and the output terminal 232 of the first source follower 23. When the voltage difference between the input terminal 231 of the first source follower 23 and the output terminal 232 of the first source follower 23 does not change, the voltage difference between the source electrode S and the base terminal B of the differential input pair transistor does not change, so that the $V_{SB}$ of the differential input pair transistor can be a constant. Thereby, the threshold voltage $V_{TH}$ of the differential input pair transistor is a constant, thereby improving the linearity of the differential input pair transistor.

For example, multiple first source followers 23 are provided. FIG. 6 illustrates an exemplary case in which four first source followers 23 are provided. Each first source follower 23 is a PMOS transistor or an NMOS transistor. The P-type differential input pair transistor is electrically connected to the NMOS transistor, and the N-type differential input pair transistor is electrically connected to the PMOS transistor.

The PMOS transistor includes: a gate electrode that is the input terminal 231 of the first source follower, a source electrode that is the output terminal 232 of the first source follower, and a drain electrode that is electrically connected to the second power supply input terminal VEE. The NMOS transistor includes: a gate electrode that is the input terminal 231 of the first source follower, a source electrode that is the output terminal 232 of the first source follower, and a drain electrode that is electrically connected to the first power supply input terminal VDD.

Specifically, the second power supply input terminal VEE of the interpolation operational amplifier circuit may be a ground terminal GND. Taking the PMOS transistor as an example, the gate electrode of the PMOS transistor is electrically connected to the source electrode S of the differential input pair transistor, and the source electrode of the PMOS transistor is electrically connected to the base terminal B of the differential input pair transistor. Therefore, voltages of the source electrode S and the base terminal B of the differential input pair transistor are equal to voltages of the gate electrode and the source electrode of the PMOS transistor. When a current flowing through the PMOS transistor is a constant, the voltage difference $V_{GS}$ between the gate electrode and the source electrode of the PMOS transistor remains constant, so that the voltage difference $V_{SB}$ between the base terminal B and the source electrode S of the differential input pair transistor remains constant. In this way, the threshold voltage $V_{TH}$ of the differential input pair transistor is a constant, thereby improving the linearity of the differential input pair transistor.

It should be noted that an operation principle of the NMOS transistor is similar with the above, and will not be further described herein.

In addition, a turn-on voltage of the first source follower 23 is smaller than the turn-on voltage between the base terminal B and the source electrode S of the differential input pair transistor.

Specifically, a PN junction is provided between the base terminal B and the source electrode S of the differential input pair transistor, and the turn-on voltage of the first source follower 23 is smaller than the turn-on voltage between the base terminal B and the source electrode S of the differential input pair transistor. In this way, a following effect of the first source follower 23 can be guaranteed, and a leakage current between the base terminal B and the source electrode S of the differential input pair transistor can be avoided, which would otherwise cause current consumption. For example, when the first source follower 23 is a PMOS transistor, in order to make the PMOS transistor have a voltage following effect, it is necessary to ensure that the voltage difference $V_{GS}$ between the gate electrode and the source electrode of the PMOS transistor is larger than the threshold voltage $V_{TH}$ of the PMOS transistor, so that the PMOS transistor is turned on. When the PMOS transistor is turned on, the voltage difference $V_{GS}$ between the gate electrode and the source electrode is smaller than the turn-on voltage between the base terminal B and the source electrode S of the differential input pair transistor, so that a leakage current between the base terminal B and the source electrode S of the differential input pair transistor can be avoided, which would otherwise cause current consumption. Therefore, the turn-on voltage of the PMOS transistor, i.e., the threshold voltage $V_{TH}$, can be set to be smaller than the turn-on voltage between the base terminal B and the source electrode S of the differential input pair transistor.

Figure 7:
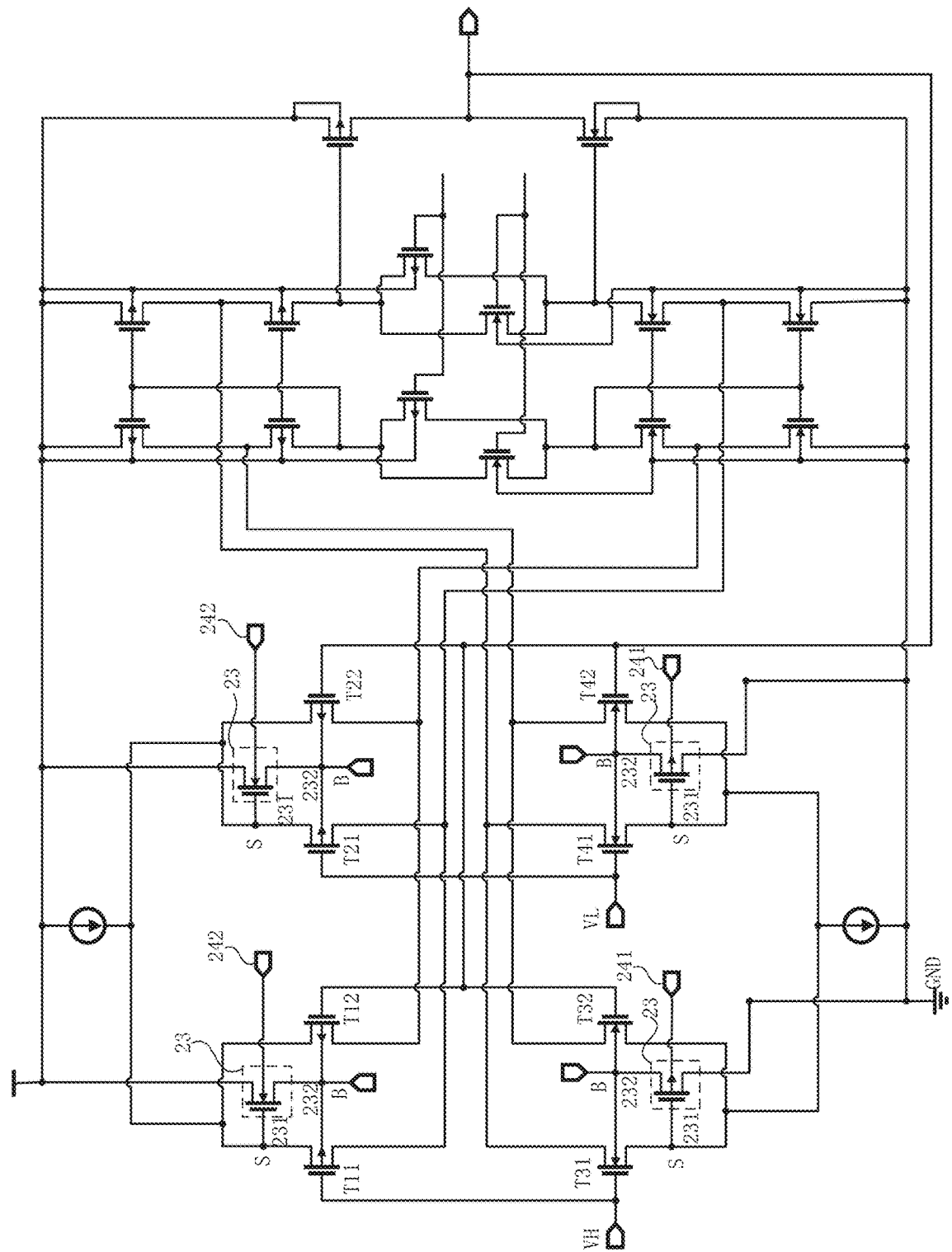
FIG. 7 is a schematic diagram of another interpolation operational amplifier circuit according to an embodiment of the present disclosure.

FIG. 7 is a schematic diagram of another interpolation operational amplifier circuit according to an embodiment of the present disclosure. As shown in FIG. 7, the voltage control unit 20 further includes a second voltage input terminal 241 and a third voltage input terminal 242. The second voltage input terminal 241 is electrically connected to the base terminal of the PMOS transistor, so as to provide a second voltage to the base terminal of the PMOS transistor. The third voltage input terminal 242 is electrically connected to the base terminal of the NMOS transistor, so as to provide a third voltage to the base terminal of the NMOS transistor. The second voltage is smaller than the voltage of the source electrode of the PMOS transistor, and the third voltage is larger than the voltage of the source electrode of the NMOS transistor.

Specifically, as shown in FIG. 7, the third voltage is a constant, so that the voltage difference between the base terminal and the source electrode of the NMOS transistor is a constant, and thus the threshold voltage of the NMOS transistor is a constant, thereby improving the linearity of the NMOS transistor. When the third voltage is larger than the voltage of the source electrode of the NMOS transistor, the voltage difference $V_{SB}$ between the base terminal and the source electrode is a negative value. According to the formula (2), it can be known that the threshold voltage of the NMOS transistor is smaller than an eigenvalue of the threshold voltage, so that the threshold voltage of the NMOS transistor can be decreased in such a manner that the turn-on voltage of the NMOS transistor is smaller than the turn-on voltage between the base terminal B and source electrode S of the P-type differential input pair transistor. Therefore, while guaranteeing the voltage following effect of the NMOS transistor, this can further avoid a leakage current between the base terminal B and the source electrode S of the P-type differential input pair transistor, which would otherwise cause current consumption.

Similarly, the second voltage is a constant, so the voltage difference between the base terminal and the source electrode of the PMOS transistor is a constant, and thus the threshold voltage of the PMOS transistor is a constant, thereby improving the linearity of the PMOS transistor. When the second voltage is smaller than the voltage of the source electrode of the PMOS transistor, the voltage difference $V_{SB}$ between the base terminal and the source electrode of the PMOS transistor is a positive value, and thus the threshold voltage of the PMOS transistor is decreased.

Figure 8:
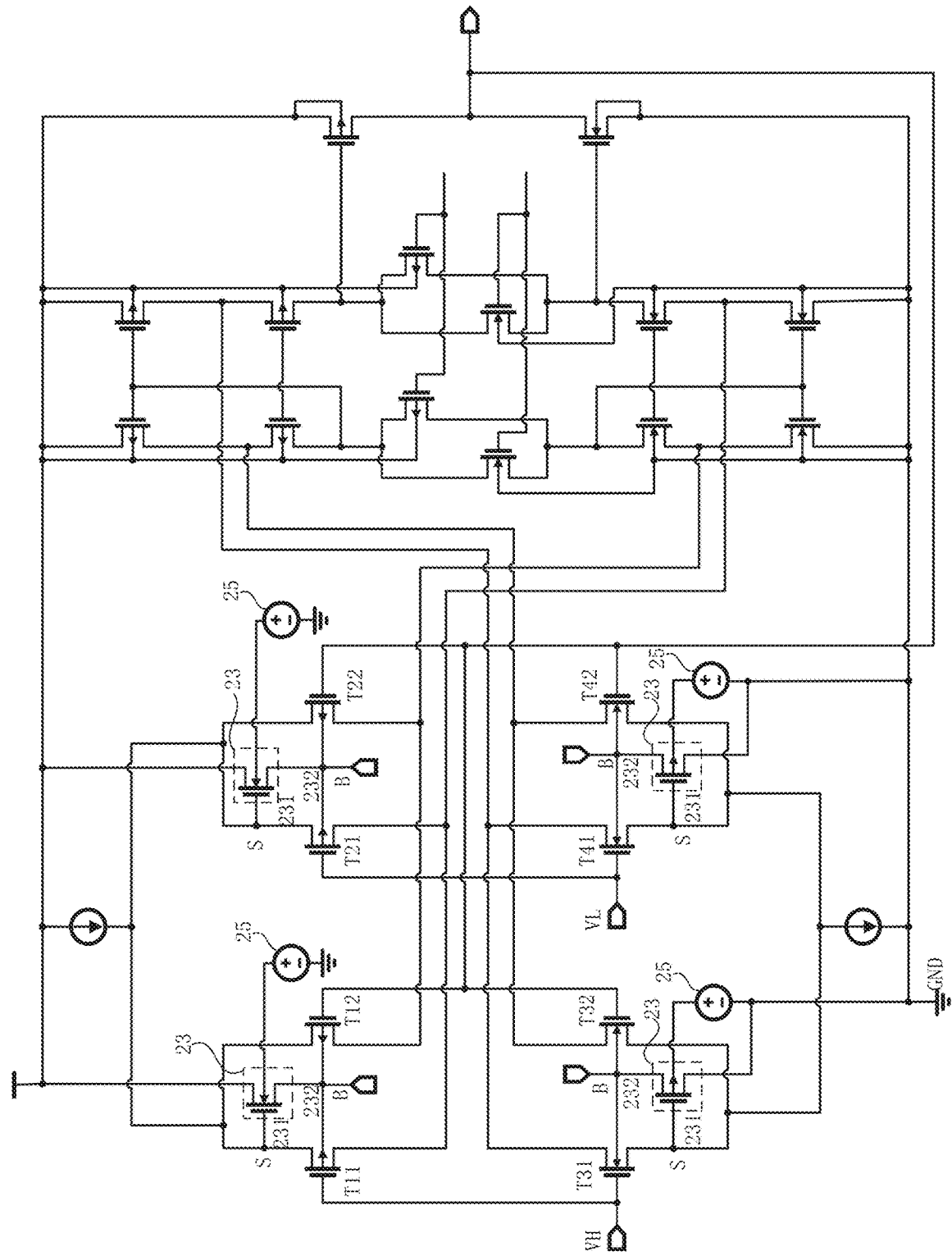
FIG. 8 is a schematic diagram of another interpolation operational amplifier circuit according to an embodiment of the present disclosure.

FIG. 8 is a schematic diagram of another interpolation operational amplifier circuit according to an embodiment of the present disclosure. As shown in FIG. 8, the voltage control unit 20 further includes at least two second source followers 25. At least one second source follower 25 includes an input terminal electrically connected to the source electrode of the PMOS transistor, and an output terminal electrically connected to the base terminal of the PMOS transistor. At least another second source follower 25 includes an input terminal electrically connected to the second power supply input terminal VEE, and an output terminal electrically connected to the base terminal of the NMOS transistor.

Specifically, FIG. 8 exemplarily illustrates a case in which four second source followers 25 are provided. The second source followers 25 have a function of voltage maintenance. For two of the four second source followers 25, the input terminal of the second source follower 25 is electrically connected to the source electrode of the PMOS transistor, and the output terminal of the second source follower 25 is electrically connected to the base terminal of the PMOS transistor, so that a voltage difference between the source electrode and the base terminal of the PMOS transistor is equal to a voltage difference between an input terminal and an output terminal of the second source follower 25. When the voltage difference between the input terminal and the output terminal of the second source follower 25 does not change, the voltage difference between the source electrode and the base terminal of the PMOS transistor does not change, so that the voltage difference between the source electrode and the base terminal of the PMOS transistor can be a constant, and thus the threshold voltage of the PMOS transistor is a constant. Therefore, the linearity of the PMOS transistor can be improved. Moreover, the voltage of the base terminal of the PMOS transistor is larger than the voltage of the source electrode of the PMOS transistor, so the threshold voltage of the PMOS transistor can be decreased, and thus the turn-on voltage of the PMOS transistor is smaller than the turn-on voltage between the base terminal B and the source electrode S of the N-type differential input pair transistor. Therefore, while guaranteeing the voltage following effect of the PMOS transistor, this can avoid a leakage current between the base terminal B and the source electrode S of the N-type differential input pair transistor, which would otherwise cause current consumption. Similarly, for a case in which the other two of the four second source followers 25 are electrically connected to the NMOS transistors, the voltage following effect of the NMOS transistor can be guaranteed, and a leakage current between the base terminal B and the source electrode S of the P-type differential input pair transistor can be avoided, which would otherwise cause current consumption.

As an example, as the first source follower 23, the second source follower 25 may also be a PMOS transistor or an NMOS transistor, and a specific connection relationship thereof is similar to a connection relationship of the PMOS transistor and the NMOS transistor being the first source follower 23, which will not be further described herein.

Figure 9:
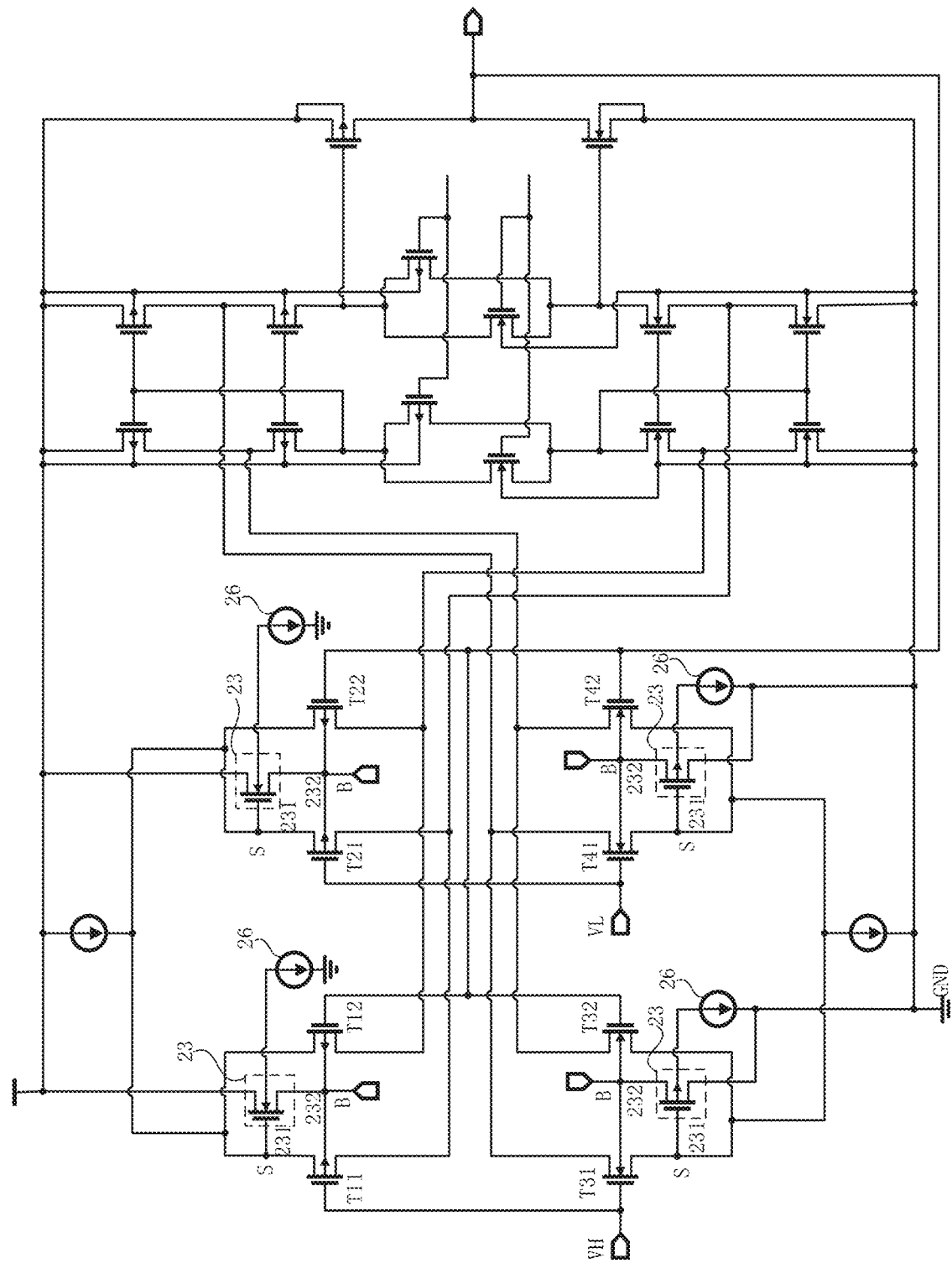
FIG. 9 is a schematic diagram of another interpolation operational amplifier circuit according to an embodiment of the present disclosure.

FIG. 9 is a schematic diagram of another interpolation operational amplifier circuit according to an embodiment of the present disclosure. As shown in FIG. 9, the voltage control unit 20 further includes at least one current source 26. The current source 26 is connected in series between the base terminal of the PMOS transistor and the source electrode of the PMOS transistor. The current source 26 is connected in series between the base terminal of the NMOS transistor and the second power supply input terminal VEE.

Specifically, the current source 26 can provide a small constant current between the base terminal and the source electrode of each of the PMOS transistor and the NMOS transistor, so that the PMOS transistor and the NMOS transistor are weakly turned on. Thus, a voltage difference between the base terminal and the source electrode of each of the PMOS transistor and the NMOS transistor is relatively small. According to the formula (2), the voltage difference between the base terminal and the source electrode of the PMOS transistor is relatively small, so that the threshold voltage of each of the PMOS transistor and the NMOS transistor is relatively small, and thus a turn-on voltage of each of the PMOS transistor and the NMOS transistor is smaller than the turn-on voltage between the base terminal B and the source electrode S of the differential input pair transistor. Therefore, while guaranteeing the voltage following effect of the PMOS transistor and the NMOS transistor, this can avoid a leakage current between the base terminal B and the source electrode S of the differential input pair transistor, which would otherwise cause current consumption.

Figure 10:
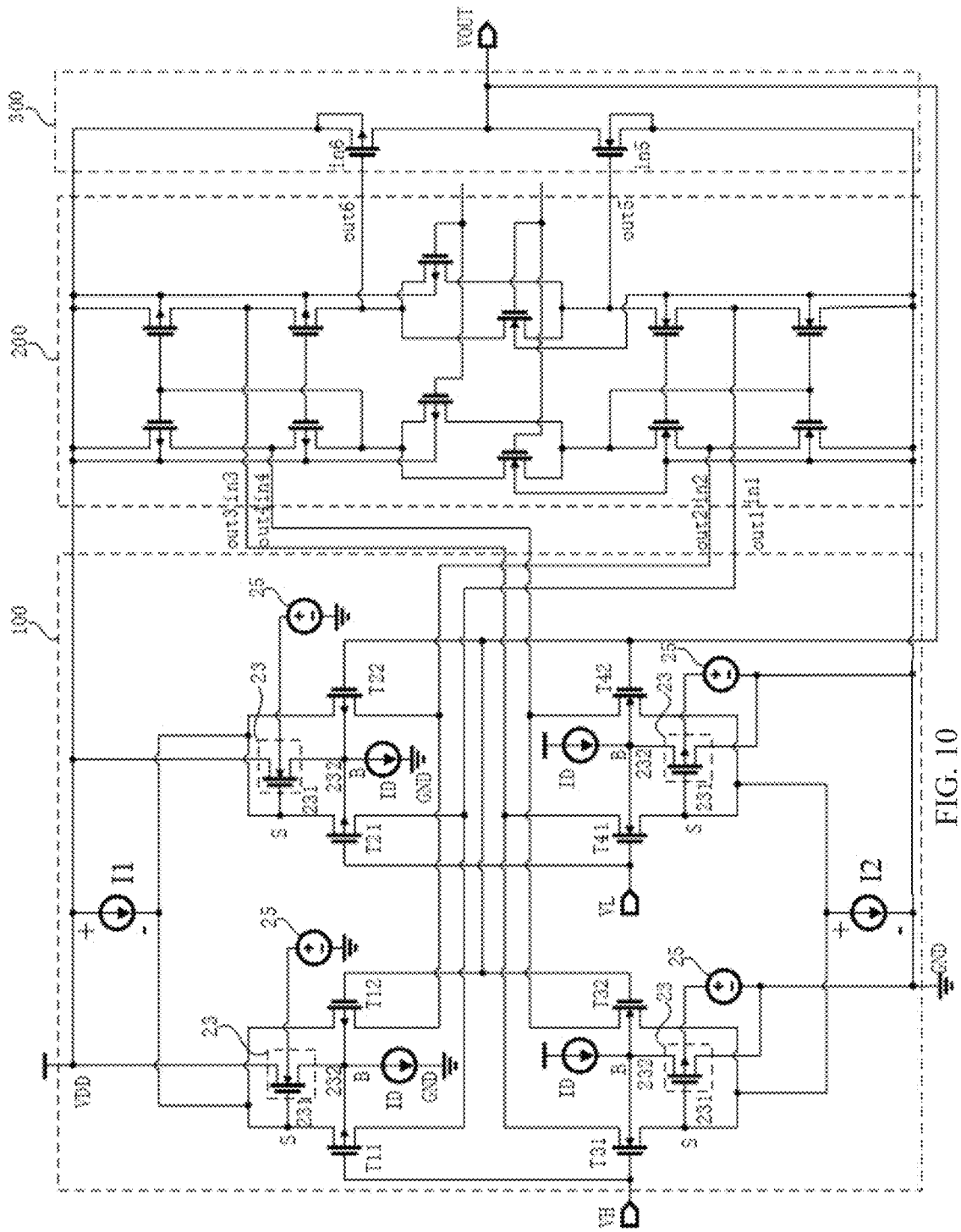
FIG. 10 is a schematic diagram of another interpolation operational amplifier circuit according to an embodiment of the present disclosure.

FIG. 10 is a schematic diagram of another interpolation operational amplifier circuit according to an embodiment of the present disclosure. As shown in FIG. 10, the voltage control unit 20 includes a PMOS transistor, a second source follower 25 and a drain current source $I_D$. The PMOS transistor serves as the first power supply follower and is electrically connected to the base terminal and the source electrode of the N-type differential input pair transistor, and the NMOS transistor serves as the first power supply follower and is electrically connected to the base terminal and the source electrode of the P-type differential input pair transistor, so as to control the voltage difference between the base terminal and the source electrode of the differential input pair transistor to be a constant, thereby improving the linearity of the differential input pair transistor. At the same time, the threshold voltage of the differential input pair transistor can be decreased. The second source follower 25 is electrically connected to the first source follower, so as to control the voltage difference between the base terminal and the source electrode of each of the PMOS transistor and the NMOS transistor to be a constant. At the same time, the voltage difference between the base terminal and the source electrode of each of the PMOS transistor and the NMOS transistor can be decreased, thereby decreasing the threshold voltage of each of the PMOS transistor and the NMOS transistor. The drain current source $I_D$ is configured to provide a small constant current for the drain electrode of each of the PMOS transistor and the NMOS transistor, so that the PMOS transistor and the NMOS transistor are turned on, and thus the voltage difference between the base terminal and the source electrode of the differential input pair transistor is a constant.

With further reference to FIG. 10, at least two sets of differential input pair transistors include four differential input pair transistors forming a differential stage amplifier circuit 100 of an interpolation operational amplifier circuit.

The gate electrode of the first transistor T11 of the first differential input pair transistor 11 and the gate electrode of the first transistor T31 of the third differential input pair transistor 13 are electrically connected to the first input terminal V1 of the interpolation operational amplifier circuit, and the gate electrode of the first transistor T21 of the second differential input pair transistor 12 and the gate electrode of the first transistor T41 of the fourth differential input pair transistor 14 are electrically connected to the second input terminal V2 of the interpolation operational amplifier circuit. The gate electrodes of the second transistors of the four differential input pair transistors (including four second transistors T12, T22, T32, and T42) are electrically connected to the output terminal VOUT of the interpolation operational amplifier circuit. The drain electrode of the first transistor T11 of the first differential input pair transistor 11 and the drain electrode of the second transistor T21 of the second differential input pair transistor 12 are electrically connected to a first output terminal out1 of the differential stage amplifier circuit 100, and the drain electrode of the second transistor T12 of the first differential input pair transistor 11 and the drain electrode of the second transistor T22 of the second differential input pair transistor 12 are electrically connected to a second output terminal out2 of the differential stage amplifier circuit 100. The source electrodes of the first differential input pair transistor 11 and the second differential input pair transistor 12 are electrically connected to a negative terminal of a first current source I1. A positive terminal of the first current source I1, and base terminals of the first differential input pair transistor 11 and the second differential input pair transistor 12 are electrically connected to the first power supply input terminal VDD of the interpolation operational amplifier circuit.

The gate electrodes of the second transistors (including the second transistors T32 and T42) of the third differential input pair transistor 13 and the fourth differential input pair transistor 14 are electrically connected to the output terminal VOUT of the interpolation operational amplifier circuit. The drain electrode of the first transistor T31 of the third differential input pair transistor 13 and the drain electrode of the first transistor T41 of the fourth differential input pair transistor 14 are electrically connected to a third output terminal out3 of the differential stage amplifier circuit 100. The drain electrode of the second transistor T32 of the third differential input pair transistor 13 and the drain electrode of the second transistor T42 of the fourth differential input pair transistor 14 are electrically connected to a fourth output terminal out4 of the differential stage amplifier circuit 100. The source electrodes of the third differential input pair transistor 13 and the fourth differential input pair transistor 14 are electrically connected to a positive terminal of a second current source 12. A negative terminal of the second current source 12, and the base terminals of the third differential input pair transistor 13 and the fourth differential input pair transistor 14 are electrically connected to the second power supply input terminal VSS of the interpolation operational amplifier circuit.

Specifically, four differential input pair transistors are provided, and each input terminal of the interpolation operational amplifier circuit corresponds to two differential input pair transistors, so that the voltage difference between two input terminals of the interpolation operational amplifier circuit can be within a larger range.

For example, the transistors of the first differential input pair transistor 11 and the third differential input pair transistor 13 are PMOS transistors, and the transistors of the second differential input pair transistor 12 and the fourth differential input pair transistor 14 are NMOS transistors.

With further reference to FIG. 10, the interpolation operational amplifier circuit further includes an intermediate stage amplifier circuit 200 and an output stage amplifier circuit 300.

The first output terminal out1 of the differential stage amplifier circuit 100 is electrically connected to a first input terminal in1 of the intermediate stage amplifier circuit 200, the second output terminal out2 of the differential stage amplifier circuit 100 is electrically connected to a second input terminal in2 of the intermediate stage amplifier circuit 200, the third output terminal out3 of the differential stage amplifier circuit 100 is electrically connected to a third input terminal in3 of the intermediate stage amplifier circuit 200, and the fourth output terminal out4 of the differential stage amplifier circuit 100 is electrically connected to a fourth input terminal in4 of the intermediate stage amplifier circuit 200. A first output terminal out5 of the intermediate stage amplifier circuit 200 is electrically connected to a first input terminal in5 of the output stage amplifier circuit 300, and a second output terminal out6 of the intermediate stage amplifier circuit 200 is electrically connected to a second input terminal in6 of the output stage amplifier circuit 300. An output terminal of the output stage amplifier circuit 300 is the output terminal VOUT of the interpolation operational amplifier circuit.

Specifically, the intermediate stage amplifier circuit 200 may be an amplifier circuit in a folding form, which is configured to amplify a voltage signal outputted from the differential stage amplifier circuit 100. The output stage amplifier circuit 300 includes a P-type transistor and an N-type transistor, and an output channel thereof can be selected based on a magnitude of an output voltage.

An embodiment of the present disclosure further provides a display panel. FIG. 11 is a schematic diagram of a structure of a display panel according to an embodiment of the present disclosure. As shown in FIG. 11, the display panel includes a substrate 101 and a source driver 102, and the source driver 102 includes the interpolation operational amplifier circuit provided by any embodiment of the present disclosure.

The substrate 101 has a display area AA and a non-display area NAA. The source driver 102 is arranged in the non-display area NAA, and the source driver 102 is electrically connected to a data signal line of the display panel, so as to provide a data signal to the display panel.

Specifically, the display area AA of the display panel is provided with pixel units. The source driver 102 provides a data voltage signal to the pixel units through the data signal line. Here, the interpolation operational amplifier circuit of the source driver 102 provides the display panel with data voltage signals corresponding to different grayscales by means of an interpolation method. When the linearity of the interpolation operational amplifier circuit is improved, a difference between a data voltage obtained by the interpolation operational amplifier circuit and a standard data voltage of a corresponding grayscale is decreased, thereby decreasing a difference between the grayscale displayed by the display panel and an expected grayscale. Thus, the display accuracy of the display panel can be improved.

It should be noted that the above description is merely for illustrating preferred embodiments of the present disclosure and a technical principle applied thereto. Those skilled in the art will understand that the present disclosure is not limited to the specific embodiments described herein, for those skilled in the art, various obvious changes, readjustments, mutual combinations and substitutions can be made without departing from a scope of the present disclosure. Therefore, although the present disclosure has been described in details through the above embodiments, the present disclosure is not limited to the above embodiments. Without departing from a concept of the present disclosure, more equivalent embodiments may be included, and the scope of the present disclosure will be determined by a scope of the appended claims.

What is claimed is:

1. An interpolation operational amplifier circuit, comprising:
   a first power supply input terminal and a second power supply input terminal, wherein a first power supply voltage of the first power supply input terminal is larger than a second power supply voltage of the second power supply input terminal;
   at least two sets of differential input pair transistors, each set of differential input pair transistors comprising a P-type differential input pair transistor composed of P-type transistors and an N-type differential input pair transistor composed of N-type transistors, wherein each differential input pair transistor of the at least two sets of differential input pair transistors comprises a first transistor and a second transistor, a gate electrode of the first transistor of at least one set of the at least two sets of differential input pair transistors is electrically connected to a first input terminal of the interpolation operational amplifier circuit, and a gate electrode of the first transistor of at least another set of the at least two sets of differential input pair transistors is electrically connected to a second input terminal of the interpolation operational amplifier circuit; for each differential input pair transistor of the at least two sets of differential input pair transistors, body terminals of the first transistor and the second transistor of the differential input pair transistor are electrically connected to each other to serve as a body terminal of the differential input pair transistor, and source electrodes of the first transistor and the second transistor of the differential input pair transistor are electrically connected to each other to serve as a source electrode of the differential input pair transistor; and
   voltage control units each electrically connected to the body terminal of the differential input pair transistor and the source electrode of the differential input pair transistor, and configured to control a voltage of the body terminal of the P-type differential input pair transistor to be smaller than the first power supply voltage of the first power supply input terminal, and/or to control a voltage of the body terminal of the N-type differential input pair transistor to be larger than the second power supply voltage of the second power supply input terminal.

2. The interpolation operational amplifier circuit according to claim 1, wherein each of the voltage control units comprises a conductive wire, and the conductive wire is electrically connected to the body terminal and the source electrode of the differential input pair transistor.

3. The interpolation operational amplifier circuit according to claim 1, wherein each of the voltage control units comprises a first voltage input terminal; the first voltage input terminal is electrically connected to the body terminal of the differential input pair transistor, so as to provide a first voltage to the body terminal of the differential input pair transistor; the first voltage is smaller than a voltage of the source electrode of the P-type differential input pair transistor, and the first voltage is larger than a voltage of the source electrode of the N-type differential input pair transistor.

4. The interpolation operational amplifier circuit according to claim 3, wherein a difference between the first voltage and the voltage of the source electrode of the differential input pair transistor is smaller than a PN junction forward turn-on voltage between the body terminal and the source electrode of the differential input pair transistor.

5. The interpolation operational amplifier circuit according to claim 3, wherein each of the voltage control units further comprises at least one first source follower; each of the at least one first source follower comprises an input terminal electrically connected to the source electrode of the differential input pair transistor, and an output terminal electrically connected to the body terminal of the differential input pair transistor.

6. The interpolation operational amplifier circuit according to claim 5, wherein a turn-on voltage of the at least one first source follower is smaller than a turn-on voltage between the body terminal and the source electrode of the differential input pair transistor.

7. The interpolation operational amplifier circuit according to claim 5, wherein each of the at least one first source follower is a PMOS transistor or an NMOS transistor; the P-type differential input pair transistor is electrically connected to the NMOS transistor, and the N-type differential input pair transistor is electrically connected to the PMOS transistor;
   each of the PMOS transistor and the NMOS transistor comprises: a gate electrode that is the input terminal of one of the at least one first source follower, and a source electrode that is an output terminal of one of the at least one first source follower; the PMOS transistor further comprises a drain electrode electrically connected to the second power supply input terminal, and the NMOS transistor further comprises a drain electrode electrically connected to the first power supply input terminal.

8. The interpolation operational amplifier circuit according to claim 7, wherein one of the voltage control units further comprises a second voltage input terminal, and another one of the voltage control units further comprises a third voltage input terminal; the second voltage input terminal is electrically connected to a body terminal of the PMOS transistor, so as to provide a second voltage to the body terminal of the PMOS transistor; the third voltage input is electrically connected to a body terminal of the NMOS transistor, so as to provide a third voltage to the body terminal of the NMOS transistor; the second voltage is smaller than a voltage of the source electrode of the PMOS transistor, and the third voltage is larger than a voltage of the source electrode of the NMOS transistor.

9. The interpolation operational amplifier circuit according to claim 8, wherein the voltage control units further comprise at least two second source followers, the at least two second source followers comprise: at least one second source follower comprising an input terminal electrically connected to the source electrode of the PMOS transistor, and an output terminal electrically connected to the body terminal of the PMOS transistor; and at least one second source follower comprising an input terminal electrically connected to the second power supply input terminal, and an output terminal electrically connected to the body terminal of the NMOS transistor.

10. The interpolation operational amplifier circuit according to claim 7, wherein the voltage control units further comprise at least one current source connected in series between the body terminal of the PMOS transistor and the source electrode of the PMOS transistor and/or connected in series between the body terminal of the NMOS transistor and the second power supply input terminal.

11. The interpolation operational amplifier circuit according to claim 1, wherein the at least two sets of differential input pair transistors comprise four differential input pair transistors forming a differential stage amplifier circuit of the interpolation operational amplifier circuit, the four differential input pair transistors comprising a first differential input pair transistor, a second differential input pair transistor, a third differential input pair transistor and a fourth differential input pair transistor;

the gate electrode of the first transistor of the first differential input pair transistor and the gate electrode of the first transistor of the third differential input pair transistor are electrically connected to the first input terminal of the interpolation operational amplifier circuit, and the gate electrode of the first transistor of the second differential input pair transistor and the gate electrode of the first transistor of the fourth differential input pair transistor are electrically connected to the second input terminal of the interpolation operational amplifier circuit; the gate electrodes of the second transistors of the four differential input pair transistors are electrically connected to an output terminal of the interpolation operational amplifier circuit; a drain electrode of the first transistor of the first differential input pair transistor and a drain electrode of the first transistor of the second differential input pair transistor are electrically connected to a first output terminal of the differential stage amplifier circuit, and a drain electrode of the second transistor of the first differential input pair transistor and a drain electrode of the second transistor of the second differential input pair transistor are electrically connected to a second output terminal of the differential stage amplifier circuit; the source electrodes of the first differential input pair transistor and the second differential input pair transistor are electrically connected to a negative terminal of a first current source; a positive terminal of the first current source, and body terminals of the first differential input pair transistor and the second differential input pair transistor are electrically connected to the first power supply input terminal of the interpolation operational amplifier circuit;

the gate electrodes of the second transistors of the third differential input pair transistor and the fourth differential input pair transistor are electrically connected to the output terminal of the interpolation operational amplifier circuit; a drain electrode of the first transistor of the third differential input pair transistor and a drain electrode of the first transistor of the fourth differential input pair transistor are electrically connected to a third output terminal of the differential stage amplifier circuit; a drain electrode of the second transistor of the third differential input pair transistor and a drain electrode of the second transistor of the fourth differential input pair transistor are electrically connected to a fourth output terminal of the differential stage amplifier circuit; the source electrodes of the third differential input pair transistor and the fourth differential input pair transistor are electrically connected to a positive terminal of a second current source; a negative terminal of the second current source, and the body terminals of the third differential input pair transistor and the fourth differential input pair transistor are electrically connected to the second power supply input terminal of the interpolation operational amplifier circuit.

12. The interpolation operational amplifier circuit according to claim 11, wherein the first transistor of the first differential input pair transistor, the second transistor of the first differential input pair transistor, the first transistor of the second differential input pair transistor, and the second transistor of the second differential input pair transistor are PMOS transistors; and the first transistor of the third differential input pair transistor, the second transistor of the third differential input pair transistor, the first transistor of the fourth differential input pair transistor, and the second transistor of the fourth differential input pair transistor are NMOS transistors.

13. The interpolation operational amplifier circuit according to claim 11, further comprising an intermediate stage amplifier circuit and an output stage amplifier circuit, the differential stage amplifier circuit comprises: the first output terminal electrically connected to a first input terminal of the intermediate stage amplifier circuit, the second output terminal electrically connected to a second input terminal of the intermediate stage amplifier circuit, the third output terminal electrically connected to a third input terminal of the intermediate stage amplifier circuit, and the fourth output terminal electrically connected to a fourth input terminal of the intermediate stage amplifier circuit; the intermediate stage amplifier circuit comprises a first output terminal electrically connected to a first input terminal of the output stage amplifier circuit, and a second output terminal electrically connected to a second input terminal of the output stage amplifier circuit; and output stage amplifier circuit comprises an output terminal that is the output terminal of the interpolation operational amplifier circuit.

* * * * *